(12) United States Patent
Kim et al.

(10) Patent No.: US 9,343,514 B2
(45) Date of Patent: May 17, 2016

(54) ORGANIC LIGHT EMITTING DIODE DISPLAY AND METHOD OF MANUFACTURING THE SAME

(71) Applicant: Samsung Display Co., Ltd., Yongin, Gyeonggi-Do (KR)

(72) Inventors: Nam-Jin Kim, Yongin (KR); Chul-Hwan Park, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/056,371

(22) Filed: Oct. 17, 2013

(65) Prior Publication Data

US 2014/0319477 A1  Oct. 30, 2014

(30) Foreign Application Priority Data

Apr. 26, 2013  (KR) .......................... 10-2013-0046778

(51) Int. Cl.
*H01L 27/32* (2006.01)

(52) U.S. Cl.
CPC .................................. *H01L 27/3246* (2013.01)

(58) Field of Classification Search
CPC ......... H01L 51/52; H01L 33/08; H01L 27/32; H01L 27/3262; H01J 1/62; H01J 9/00
See application file for complete search history.

(56) References Cited

U.S. PATENT DOCUMENTS

| 7,294,962 | B2 | 11/2007 | Kim et al. |
| 7,507,998 | B2 | 3/2009 | Tseng |
| 7,790,526 | B2 | 9/2010 | Tseng |
| 7,791,267 | B2 | 9/2010 | Baek et al. |
| 8,125,141 | B2 | 2/2012 | Park et al. |
| 8,143,782 | B2 | 3/2012 | Kim |
| 8,183,769 | B2 | 5/2012 | Chang et al. |
| 8,232,575 | B2 | 7/2012 | Lee et al. |
| 8,241,933 | B2 | 8/2012 | Lee et al. |
| 8,258,523 | B2 | 9/2012 | Lee et al. |
| 8,292,684 | B2 | 10/2012 | Kim et al. |
| 2006/0108587 | A1* | 5/2006 | Lee ..................... G02F 1/13439 257/72 |
| 2008/0224599 | A1* | 9/2008 | Kim ..................... H01L 27/3276 313/504 |
| 2008/0315756 | A1* | 12/2008 | Jeon ..................... H01L 27/3246 313/504 |
| 2010/0200861 | A1 | 8/2010 | Lee et al. |
| 2013/0001564 | A1 | 1/2013 | Choi et al. |

FOREIGN PATENT DOCUMENTS

| KR | 10-2007-0035857 A | 4/2007 |
| KR | 10-2007-0096082 A | 10/2007 |
| KR | 10-2011-0040244 A | 4/2011 |

\* cited by examiner

*Primary Examiner* — Fernando L Toledo
*Assistant Examiner* — Lawrence-Linh T Nguyen
(74) *Attorney, Agent, or Firm* — Robert E. Bushnell, Esq.

(57) ABSTRACT

An organic light-emitting diode (OLED) display according to an exemplary embodiment of the present invention includes a substrate, a thin film transistor formed on the substrate, a pixel electrode formed on the thin film transistor and electrically connected to the thin film transistor, a pixel definition layer formed on the pixel electrode so as to define a pixel region, an emission layer formed on the pixel electrode and contacting the pixel electrode in the pixel region, and an interlayer formed on the pixel definition layer and contacting part of the emission layer. One side of the interlayer has an uneven shape so that a surface area of the interlayer is increased.

16 Claims, 7 Drawing Sheets

ORGANIC LIGHT EMITTING DIODE DISPLAY AND METHOD OF MANUFACTURING THE SAME

CLAIM OF PRIORITY

This application makes reference to, incorporates into this specification the entire contents of, and claims all benefits accruing under 35 U.S.C. §119 from an application earlier filed in the Korean Intellectual Property Office on Apr. 26, 2013 and there duly assigned Serial No. 10-2013-0046778.

BACKGROUND OF THE INVENTION

1. Field of the Invention

The present invention relates to an organic light emitting diode (OLED) display and a method of manufacturing the same.

2. Description of the Related Art

An OLED used in a flat panel display includes an anode, a cathode and organic layers interposed between the anode and the cathode. The organic layers include a hole injection layer (HIL), a hole transport layer (HTL), an electron transport layer (ETL) and an electron injection layer (EIL) in addition to an emission layer. OLEDs are categorized into a polymer OLED and a low molecular weight OLED according to the composition of an organic layer, particularly, an emission layer.

To implement full colors, the organic layer needs to be patterned on a substrate. A shadow mask is used to pattern an organic layer of a low molecular weight OLED. An organic layer of a polymer OLED is patterned using inkjet printing or laser induced thermal imaging (LITI).

Unlike inkjet printing that is a wet process, LITI is a dry process which can finely pattern the organic layer.

A method of forming a polymer organic layer pattern using LITI requires at least a light source, an acceptor substrate and a donor substrate. The acceptor substrate is a display substrate on which an organic layer is formed and the donor substrate includes a transfer layer composed of a base film, a photothermal conversion layer and an organic layer.

Patterning of an organic layer on the acceptor substrate is performed in such a manner that the photothermal conversion layer absorbs a laser emitted from the light source and converts the laser into thermal energy, and the organic layer forming the transfer layer is transferred onto the acceptor substrate according to the thermal energy.

However, part of the organic layer that needs to be transferred to the display substrate using the laser may remain in the transfer layer during a transfer process.

The above information disclosed in this Background section is only for enhancement of an understanding of the background of the invention, and therefore it may contain information that does not form the prior art that is already known in this country to a person of ordinary skill in the art.

SUMMARY OF THE INVENTION

The present invention has been developed in an effort to provide an OLED display and a method of manufacturing the same having the advantage of completely separating a transfer layer of a transfer region of a donor substrate from a transfer layer disposed around the transfer area so that the separated transfer layer can be transferred onto a pixel region during a process of forming an organic emission layer through thermal transfer.

An exemplary embodiment provides an organic light-emitting diode (OLED) display, including: a substrate; a thin film transistor formed on the substrate; a pixel electrode formed on the thin film transistor and electrically connected to the thin film transistor; a pixel definition layer formed on the pixel electrode so as to define a pixel region; an emission layer formed on the pixel electrode and contacting the pixel electrode in the pixel region; and an interlayer formed on the pixel definition layer and contacting part of the emission layer. One side of the interlayer has an uneven shape so that the surface area of the interlayer increases.

The uneven shape is irregular.

An upper side of the interlayer may have an uneven shape.

A part of the upper side of the interlayer may have protrusions and depressions.

The interlayer may be formed along the edge of the emission layer.

The interlayer may be formed in a round shape so that the pixel electrode disposed in the pixel region is exposed.

Another exemplary embodiment of the present invention provides an OLED display substrate, including: a substrate; a thin film transistor formed on the substrate; a pixel electrode formed on the thin film transistor and electrically connected to the thin film transistor; a pixel definition layer formed on the pixel electrode so as to define a pixel region; and an emission layer formed on the pixel electrode and contacting the pixel electrode in the pixel region, wherein one side of the pixel definition layer is hydrophilic, and the emission layer covers the pixel electrode and the one side of the pixel definition layer.

An upper side of the pixel definition layer may be hydrophilic.

The one side of the pixel definition layer may be treated with plasma using one of oxygen, nitrogen and argon.

Another exemplary embodiment of the present invention provides a method of manufacturing an OLED display, including: forming a thin film transistor on a substrate; forming a pixel electrode on the thin film transistor, the pixel electrode being electrically connected to the thin film transistor; forming a pixel definition layer for defining a pixel region on the pixel electrode; forming an interlayer by processing one side of the pixel definition layer into an uneven surface so that the surface area of the pixel definition layer increases; and forming an emission layer contacting the pixel electrode in the pixel region; wherein the emission layer covers the pixel electrode and the one side of the interlayer.

The forming of the interlayer may include processing an upper side of the interlayer into an uneven shape.

The forming of the emission layer may include: disposing a donor substrate on which a transfer layer forming the emission layer is formed above the pixel region; and transferring the transfer layer onto the pixel region.

The transfer layer may cover the pixel electrode and the upper side of the interlayer.

Another exemplary embodiment of the present invention provides a method of manufacturing an OLED display, including: forming a thin film transistor on a substrate; forming a pixel electrode electrically connected to the thin film transistor on the thin film transistor; forming a pixel definition layer for defining a pixel region on the pixel electrode; treating one side of the pixel definition layer with plasma; and forming an emission layer to cover the pixel electrode disposed in the pixel region and the one side of the pixel definition layer.

The plasma treatment may be performed using one of oxygen, nitrogen and argon.

The plasma treatment may be performed on the upper side of the pixel definition layer.

The forming of the emission layer may include: disposing a donor substrate on which a transfer layer forming the emission layer is formed above the pixel region; and transferring the transfer layer onto the pixel region.

The transfer layer may cover the pixel electrode and the upper side of the pixel definition layer.

In an OLED display according to an exemplary embodiment of the present invention, a transfer layer of a donor substrate, irradiated by laser, can be completely separated from the donor substrate to form an organic emission layer.

A method of manufacturing an OLED display according to an exemplary embodiment of the present invention can prevent part of a transfer layer of a transfer region irradiated by laser from being left on the donor substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention. The drawings and description are to be regarded as illustrative in nature and not restrictive Like reference numerals designate like elements throughout the specification.

In the drawings, dimensions and thicknesses of components are exaggerated, omitted or schematically illustrated for clarity and convenience of description. In addition, dimensions of constituent elements do not entirely reflect actual dimensions thereof.

In the drawings, the thickness of layers, films, panels, regions, etc. are exaggerated for clarity. In addition, thicknesses of some layers and areas are exaggerated for better understanding and ease of description. It will be understood that, when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements.

Furthermore, the expression "on" or "under" may be used herein to represent the relationship of one element to another element as illustrated in the figures. It will be understood that this expression is intended to encompass different orientations of the elements in addition to the orientation depicted in the figures, namely, to encompass both "on" and "under".

Figure 1:
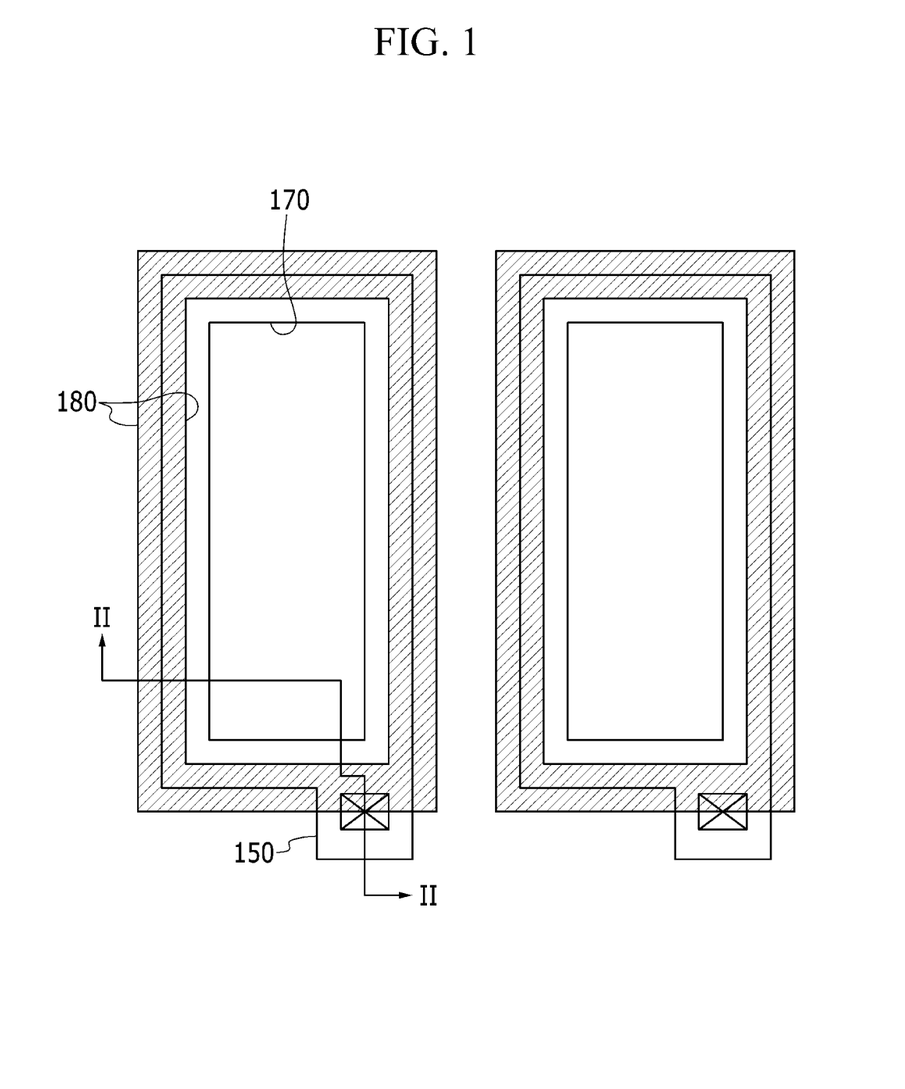
FIG. 1 is a top plan view of an OLED display according to a first exemplary embodiment of the invention.
Figure 2:
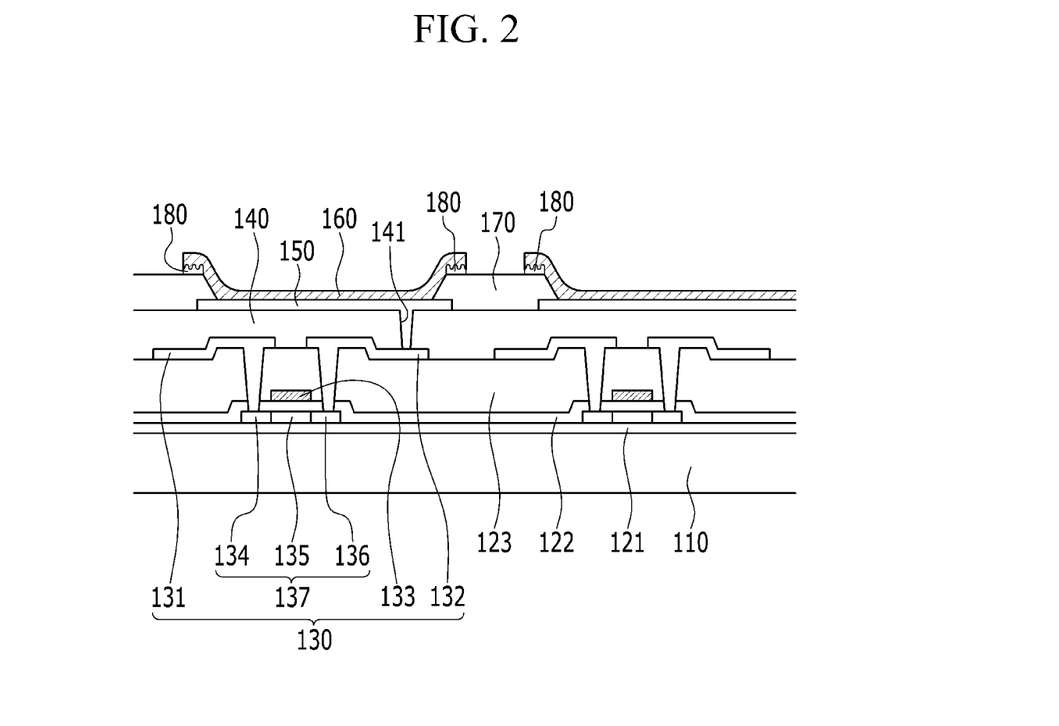
FIG. 2 is a cross-sectional view taken along line II-II of FIG. 1.

FIG. 1 is a top plan view of an OLED display according to a first exemplary embodiment of the invention, and FIG. 2 is a cross-sectional view taken along line II-II of FIG. 1.

Referring to FIGS. 1 and 2, in an OLED display according to the first exemplary embodiment, a transfer layer of a donor substrate, irradiated by laser, may be perfectly separated from the donor substrate to form an organic emission layer.

The OLED display according to the first exemplary embodiment may include a substrate 110, a thin film transistor 130, a pixel electrode 150, a pixel definition layer 170, an emission layer 160 and an interlayer 180.

The structure of the OLED display according to the first exemplary embodiment will now be described in detail in the order of lamination of layers with reference to FIGS. 1 and 2. The OLED display includes a driving thin film transistor (TFT) and the emission layer that emits light according to the driving TFT.

The substrate 110 is an insulating substrate formed of glass, quartz, ceramics, plastics, etc. However, the present invention is not limited thereto and the substrate 110 may be a metal substrate made of stainless steel.

A buffer layer 121 is formed on the substrate 110. The buffer layer 121 prevents impurities from infiltrating into the substrate 110 and planarizes the surface of the substrate 110.

The buffer layer 121 may be formed of materials capable of achieving the above-described functions. For example, the buffer layer 121 can be formed of one of SiNx, SiO2 and SiOxNy. However, the buffer layer 121 may be omitted according to the type of substrate 110 and process conditions.

A driving semiconductor layer 137 is formed on the buffer layer 121. The driving semiconductor layer 137 is formed from of polysilicon. The driving semiconductor layer 137 includes an undoped channel region 135, and a source region 134 and a drain region 136 which are doped with an impurity ion and formed on respective sides of the channel region 135. A p-type impurity such as B may be used as the impurity ion and $B_2H_6$ can be doped, for example. The impurity doped into the source and drain regions depends on the thin film transistor type.

A gate insulating layer 122 is formed of SiNx or $SiO_2$ on the driving semiconductor layer 137. A gate line including a driving gate electrode 133 is formed on the gate insulating layer 122. The driving gate electrode 133 is formed on at least part of the driving semiconductor layer 137, particularly, the channel region 135.

An interlayer insulating layer 123 is formed on the gate insulating layer 122 so as to cover the driving gate electrode 133. Through-holes exposing the source region 134 and the drain region 136 of the driving semiconductor 137 are formed in the gate insulating layer 122 and the interlayer insulating layer 123. Like the gate insulating layer 122, the interlayer insulating layer 123 may be formed of a ceramic material such as SiNx or SiO2.

A data line, including a driving source electrode 131 and a driving drain electrode 132, is formed on the interlayer insulating layer 123. The driving source electrode 131 and the driving drain electrode 132 are respectively connected to the source region 134 and the drain region 136, respectively, of the driving semiconductor layer 137 through the through-holes formed in the interlayer insulating layer 123 and the gate insulating layer 122.

The driving semiconductor layer 137, the driving gate electrode 133, the driving source electrode 131 and the driving drain electrode 132 form the driving TFT 130. The configuration of the driving TFT 130 is not limited thereto and may be changed in various ways to a known configuration.

A planarization layer 140 is formed on the interlayer insulating layer 123 so as to cover the data line. The planarization layer 140 planarizes the uneven surface of the substrate 110 so as to improve luminous efficacy of an OLED formed thereon. In addition, the planarization layer 140 has an electrode contact hole 141 exposing part of the drain electrode 132.

The planarization layer 140 may be formed of at least one of acryl-based resin, epoxy resin, phenolic resin, polyamide resin, polyimide rein, unsaturated polyester resin, poly phenylenether resin, poly phenylenesulfide resin and benzocyclobutene, BCB.

An exemplary embodiment is not limited to the above-described structure, and the planarization layer 140 or the interlayer insulating layer 123 may be omitted as necessary.

The pixel electrode 150 of the OLED is formed on the planarization layer 140. That is, the OLED includes plural pixel electrodes 150, each of which is disposed at a respective pixel. The plural pixel electrodes 150 are disposed at intervals. The pixel electrode 150 is connected to the drain electrode 132 through the electrode contact hole 141 of the planarization layer 140.

The pixel definition layer 170 having an opening for exposing the pixel electrode 150 is formed on the planarization layer 140. That is, the pixel definition layer 170 includes plural openings, each of which is formed for a respective pixel. The emission layer 160 may be formed in each opening formed by the pixel definition layer 170. Accordingly, a pixel region in which each emission layer is formed may be defined by the pixel definition layer 170.

The pixel electrode 150 is disposed in correspondence to the opening of the pixel definition layer 170. However, the position of the pixel electrode 150 is not limited to the opening of the pixel definition layer 170, and the pixel electrode 150 may be disposed under the pixel definition layer 170 so that the pixel definition layer 170 is superimposed on part of the pixel electrode 150.

The pixel definition layer 170 may be formed of a resin such as polyacrylate resin, polyimide, etc. or a silica inorganic material.

The organic emission layer 160 is formed on the pixel electrode 150. A common electrode (not shown) may be formed on the organic emission layer 160. In this manner, the OLED including the pixel electrode 150, the organic emission layer 160 and the common electrode is formed.

The organic emission layer 160 is formed of a low molecular weight organic material or a polymer organic material. The organic emission layer 160 may be formed of multiple layers including at least one of a hole injection layer (HIL), a hole transport layer (HTL), an electron transport layer (ETL) and an electron injection layer (EIL). When the organic emission layer 160 includes all of the layers, the hole injection layer (HIL) is disposed on the pixel electrode 150 corresponding to an anode and the hole transport layer (HTL), emission layer, electron transport layer (ETL) and electron injection layer (EIL) are sequentially laminated thereon.

The pixel electrode 150 and the common electrode may be formed of a transparent conductive material or a transflective or reflective conductive material. The OLED display may be a top emission, bottom emission or dual type OLED display according to materials of the pixel electrode 150 and the common electrode.

An encapsulation substrate (not shown) may be disposed on the common electrode. The encapsulation substrate may be formed of a transparent material such as glass or plastics in the case of a top emission or dual type OLED display, and may be formed of an opaque material such as a metal in the case of a bottom emission OLED display.

Further referring to FIGS. 1 and 2, in the OLED display according to the first exemplary embodiment, the interlayer 180 is formed on the pixel definition layer 170. The interlayer 180 comes into contact with part of the organic emission layer 160 formed on the pixel electrode 150.

More specifically, the edge of the organic emission layer 160 is disposed on the interlayer 180, as shown in FIG. 2. Here, the edge of the organic emission layer 160 is disposed so as to cover the entirety of the interlayer 180 or a part of the interlayer 180. Accordingly, the organic emission layer 160 covers the pixel electrode 150 exposed by the pixel definition layer 170 and the interlayer 180.

Further referring to FIG. 1, the interlayer 180 may be formed in a ring shape along the edge of the emission layer 160 so that the pixel electrode disposed in the pixel region is exposed.

Figure 3:
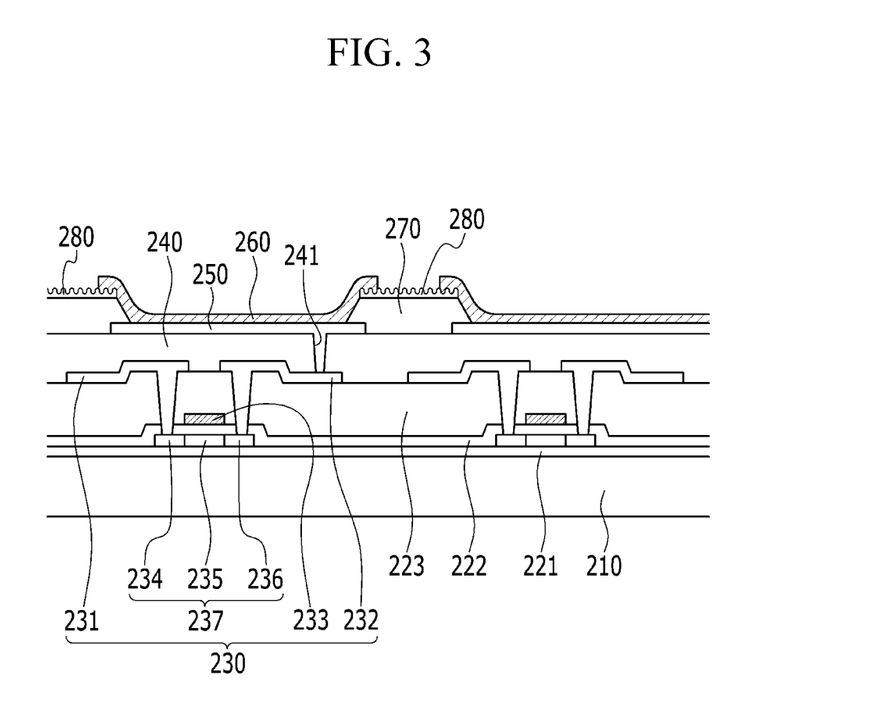
FIG. 3 is a cross-sectional view of an OLED display according to a second exemplary embodiment of the invention.

The interlayer 180 may be formed so as to cover part of the pixel definition layer 170. As shown in FIG. 2, the interlayer 180 may be formed so that the interlayer 180 is superimposed on part of the pixel definition layer 170. However, FIG. 3 is a cross-sectional view of an OLED display according to a second exemplary embodiment of the invention, and in the second exemplary embodiment, an interlayer 280 may be formed so as to cover the overall surface of a pixel definition layer 270.

According to the first exemplary embodiment, a transfer layer of a transfer region irradiated by laser is completely separated from a transfer layer disposed around the transfer region according to the interlayer 180. This will be described in detail in a method of manufacturing an OLED display according to another exemplary embodiment.

The interlayer 180 may be formed of a polymer material including acrylate or polyimide. However, the interlayer 180 is not limited thereto and may be formed of any of known polymer materials.

According to the first exemplary embodiment, one side of the interlayer 180, specifically, the surface of the interlayer 180, is processed into an uneven shape so that a surface area of the interlayer 180 increases. The contact area between the surface of the interlayer 180 and the transfer layer of the donor substrate is increased by processing the surface of the interlayer 180 into an uneven shape. Accordingly, contact force of the transfer layer and the interlayer 180 increases, and thus the transfer layer can be completely separated from the transfer region disposed around the transfer layer.

The uneven shape of the interlayer 180 may be formed through an etching or deposition process. A known etching or deposition process can be used and, as such, a detailed description thereof is omitted.

According to the first exemplary embodiment, the surface of the interlayer 180 may have uneven protrusions and depressions. Otherwise, the interlayer 180 may have even protrusions and depressions.

The protrusions and depressions may be formed only on part of the surface of the interlayer 180. That is, the protrusions and depressions are selectively formed on an upper side of the interlayer 180 rather than being formed on the overall surface of the interlayer 180.

Figure 4:
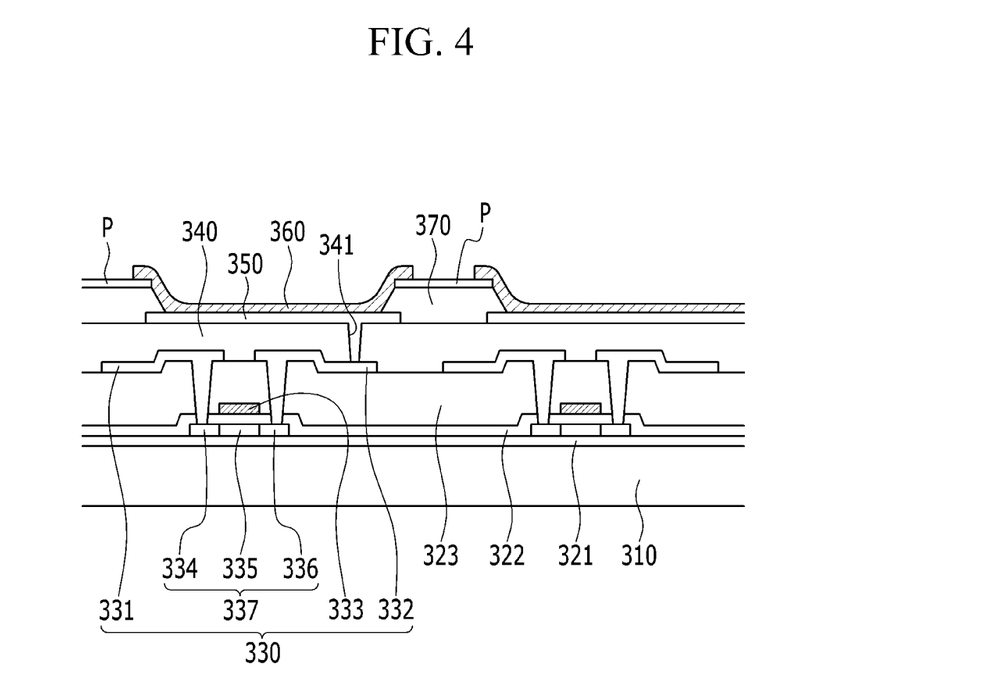
FIG. 4 is a cross-sectional view of an OLED display according to a third exemplary embodiment of the invention.

FIG. 4 is a cross-sectional view of an OLED display according to a third exemplary embodiment of the invention.

Referring to FIG. 4, in an OLED display according to the third exemplary embodiment, one side of a pixel definition layer 370, specifically, the surface of the pixel definition layer 370, is treated with plasma P. When one side of the pixel definition layer 370 is treated with plasma, the treated side of the pixel definition layer 370 becomes hydrophilic.

In the OLED display according to the third exemplary embodiment, the surface of the pixel definition layer 370, instead of the interlayers 180 and 280 of the OLED displays according to the first and second exemplary embodiments, respectively, are treated with plasma. That is, the surface of the pixel definition layer 370 is hydrophilic.

Plasma treatment forms protrusions and depressions on the surface of the pixel definition layer 370 by electrically impacting the surface of the pixel definition layer 370 or modifying the surface of the pixel definition layer 370 so as to increase attraction between the surface of the pixel definition layer 370 and the transfer layer of the donor substrate.

Here, plasma treatment collides plasma, including active species which include electrons, ions, free radicals, excitons, etc., with the surface of the pixel definition layer 370, or generates a recombination reaction.

The active species colliding with the surface of the pixel definition layer 370 activates the surface to form free radicals, causing modification and structural deformation of the surface of the pixel definition layer 370. In addition, the colliding active species can remove impurities adhering to the surface of the pixel definition layer 370.

The surface energy of the pixel definition layer 370 increases according to plasma treatment, and thus the pixel definition layer 370 can function as an efficient adhesive.

In the OLED display according to the third exemplary embodiment, plasma treatment may be performed using oxygen, nitrogen or argon.

According to the third exemplary embodiment, the edge of an organic emission layer 360 of the OLED display covers the surface of the pixel definition layer 370. More specifically, the edge of the organic emission layer 360 covers the plasma-treated surface of the pixel definition layer 370.

The edge of the transfer layer disposed in the transfer region of the donor substrate comes into contact with the plasma-treated surface of the pixel definition layer 370 during a transfer process, and thus the transfer layer can be completely separated from the transfer layer disposed around the transfer region. Here, the transfer layer separated from the donor substrate forms the organic emission layer 360 of the OLED display.

Figure 5:
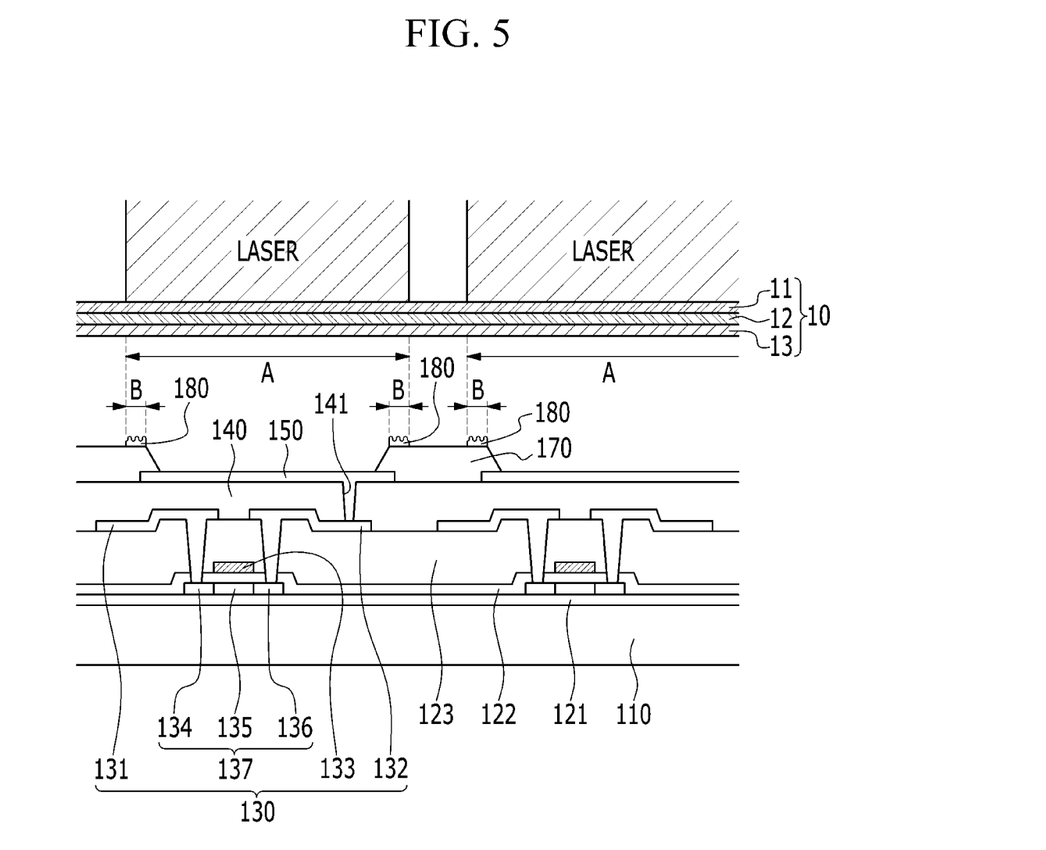
FIGS. 5 to 7 are cross-sectional views illustrating a method of manufacturing the OLED display according to the first exemplary embodiment of the invention.
Figure 6:
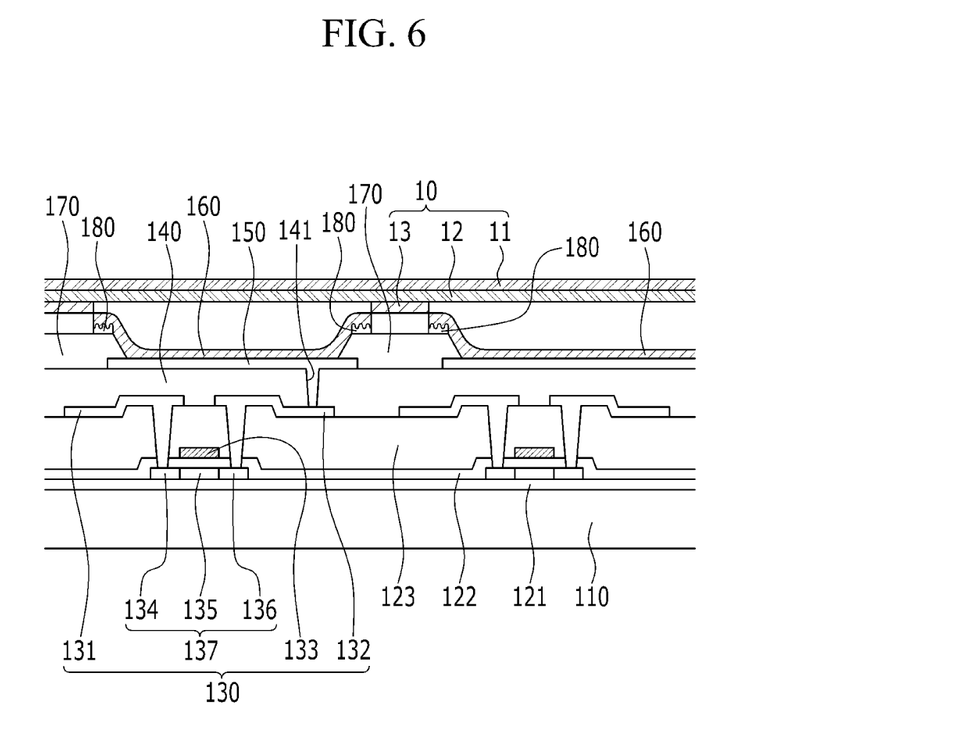
Figure 7:
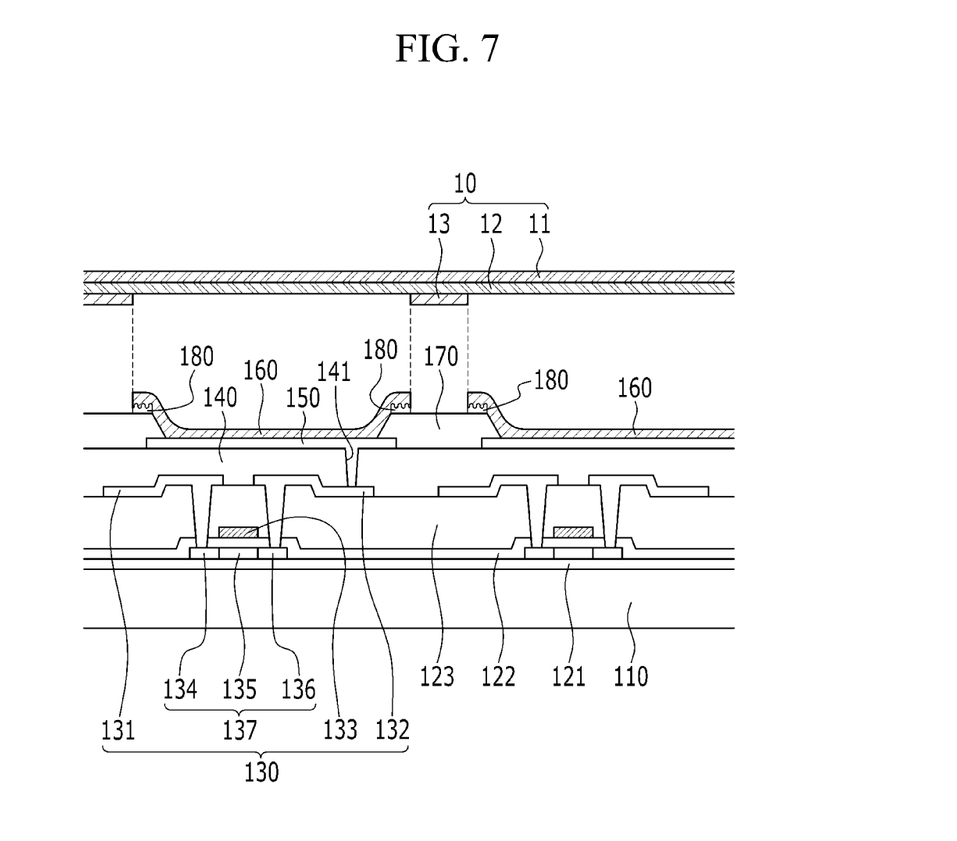

FIGS. 5 to 7 are cross-sectional views illustrating a method of manufacturing the OLED display according to the first exemplary embodiment. The method of manufacturing the OLED display will now be described with reference to FIGS. 5, 6 and 7.

Referring to FIG. 5, the method of manufacturing the OLED display according to the first exemplary embodiment completely separates a transfer layer 13 of a transfer region A, irradiated by a laser, from a transfer layer 13 disposed around the transfer region A so as to transfer the transfer layer 13 corresponding to the transfer region A onto the pixel region of the display substrate. That is, the method of manufacturing the OLED display according to the first exemplary embodiment can prevent the transfer layer corresponding to the transfer region of the donor substrate from remaining on the donor substrate.

Further referring to FIG. 5, TFTs are formed on the substrate 110. The TFTs may include the driving TFT 130 and a switching TFT (not shown). The TFTs are formed on the substrate 110 using a known TFT formation process and thus detailed description thereof is omitted.

The pixel electrode 150 is formed on the TFT 130. More specifically, the pixel electrode 150 is formed so that it is electrically connected to the drain electrode 132 of the TFT 130 through the electrode contact hole 141 of the planarization layer 140, as shown in FIG. 5.

Subsequently, the pixel definition layer 170 is formed on the pixel electrode 150. The pixel definition layer 170 defines the pixel region in which an OLED is disposed. An opening is formed in the pixel definition layer 170 to expose the pixel electrode 150.

The interlayer 180 is formed on the pixel definition layer 170. The interlayer 180 may be formed on the pixel definition layer 170 using a mask. The mask may be an exposure mask or a fine metal mask (FMM). The mask needs to have a hole formed therein in order to form the interlayer 180.

One side of the interlayer 180, specifically, the upper side of the interlayer 180, is processed into an uneven shape so as to increase the surface area of the interlayer 180. Accordingly, the contact area of the surface of the interlayer 180 and the transfer layer of the donor substrate increases.

The uneven shape of the interlayer 180 may be obtained through an etching or deposition process. In this case, a known etching or deposition process can be used, and thus detailed description thereof is omitted.

As shown in FIG. 5, the interlayer 180 may be formed so as to cover part of the pixel definition layer 170. That is, the interlayer 180 may be superimposed on part of the pixel definition layer 170. However, referring to FIG. 3, the interlayer 280 may be formed to cover the entire surface of the pixel definition layer 270, as shown in FIG. 3.

Subsequently, referring to FIG. 6, the organic emission layer 160 is formed so as to cover the pixel electrode 150 and the interlayer 180 in the pixel region. As shown in FIG. 6, the organic emission layer 160 is formed on the pixel electrode 150 exposed through the opening of the pixel definition layer 170 and the interlayer 180.

The process of forming the organic emission layer 160 will now be described with reference to FIGS. 5, 6 and 7. The process of forming the organic emission layer 160 includes a step of disposing a donor substrate 10 (FIG. 5) above the pixel region, and a step of transferring a transfer material of the transfer layer 13 onto the pixel region from the donor substrate 10.

Further referring to FIG. 5, the donor substrate 10 is disposed above the pixel region. More specifically, the donor substrate 10 is disposed so that the edge B of the transfer region A of the donor substrate 10 is superimposed on the interlayer 180. The transfer region A is irradiated by laser so as to be transferred to the pixel region.

The edge B of the transfer region A may be superimposed on the entire surface of the interlayer 180 or a part of the surface of the interlayer 180. Referring to FIGS. 5 and 6, the edge B of the transfer layer 13 is superimposed on the uneven surface of the interlayer 180. The edge B of the transfer layer 13 comes into contact with the interlayer 180 having an increased surface area during a transfer process, and thus contact force between the edge B of the transfer layer 13 and the interlayer 180 increases. Accordingly, the transfer layer of the transfer region A can be completely separated from the transfer layer disposed around the transfer region A.

The transfer layer 13 of the donor substrate 10 and the interlayer 180 may be spaced part from each other by a predetermined distance. The transfer layer 13 is spaced apart from the interlayer 180 so that the transfer layer 13 can be bent downward, and thus the edge B thereof can come into contact with the interlayer 180.

The transfer region A of the donor substrate 10 is irradiated by laser. Then, a photothermal conversion layer 12 of the donor substrate 10 is expanded. Accordingly, the transfer layer 13 disposed under the photothermal conversion layer 12 is bent downward due to the expanded photothermal conversion layer 12.

The edge B of the transfer region A comes into contact with the interlayer 180. Upon contact of the edge B of the transfer region A with the interlayer 180, the transfer layer 13 of the transfer region A is perfectly separated from the donor substrate 10 according to the contact force between the edge of the transfer layer 13 and the uneven surface of the interlayer 180.

More specifically, the transfer layer 13 is not completely separated from the donor substrate 10 at the boundary of the transfer region A according to cohesion of the transfer layer 13. However, when the edge B of the transfer region A comes into contact with the interlayer 180 with the increased surface area, the contact force of the edge B of the transfer layer 13 and the interlayer 180 increases, and thus the transfer layer 13 of the transfer region A is perfectly separated from the transfer layer 13 disposed around the transfer area A. Accordingly, it is possible to prevent the transfer layer 13 from remaining at the edge B thereof.

The transfer layer 13 transferred onto the pixel region forms the organic emission layer 160 of the OLED display. The transfer layer 13 is formed of a transfer material and this transfer material is deposited on the pixel region to form the organic emission layer 160. The transfer material of the transfer layer 13 may be an organic material.

Upon completion of transfer, the organic emission layer 160 covers the pixel electrode 150 and the interlayer 180, as shown in FIG. 7. Here, the organic emission layer 160 may cover only part of the interlayer 180.

A method of manufacturing the OLED display according to the third exemplary embodiment includes a step of treating the surface of the pixel definition layer 370 (FIG. 4) with plasma instead of the step of forming the interlayer in the method of manufacturing the OLED display according to the first exemplary embodiment.

In the method of manufacturing the OLED display according to the third exemplary embodiment, the TFT 330, pixel electrode 350 and pixel definition layer 370 are sequentially formed in the same manner as in the method of manufacturing the OLED display according to the first exemplary embodiment.

Subsequently, one side of the pixel definition layer 370, more specifically, the surface of the pixel definition layer 370, is treated with plasma. As described above, plasma treatment forms protrusions and depressions on the surface of the pixel definition layer 370 by applying electric impact to the surface or modifies the surface of the pixel definition layer 370 to increase attraction between the surface of the pixel definition layer 370 and the transfer layer of the donor substrate.

The surface energy of the pixel definition layer 370 increases according to plasma treatment, and thus the pixel definition layer 370 can function as an efficient adhesive.

In the method of manufacturing the OLED display according to the third exemplary embodiment, plasma treatment can be performed using oxygen, nitrogen or argon.

The organic emission layer 360 is formed to cover the pixel electrode 350 and the surface of the pixel definition layer 370 disposed in the pixel region. As shown in FIG. 4, the organic emission layer 360 is superimposed on the pixel electrode 350 exposed through the opening of the pixel definition layer 370 and the surface of the pixel definition layer 370.

The process of forming the organic emission layer 360 includes a step of disposing the donor substrate (FIGS. 5 thru 7) above the pixel region, and a step of transferring the transfer material of the transfer layer 13 onto the pixel region from the donor substrate 10 in the same manner as in the method of manufacturing the OLED display according to the first exemplary embodiment. The step of transferring the transfer material using the donor substrate 10 is identical to that of the method of manufacturing the OLED display according to the first exemplary embodiment, and thus detailed description thereof is omitted.

In an OLED display and a method of manufacturing the same according to an exemplary embodiment, the transfer layer of the transfer region of the donor substrate, irradiated by laser, is completely separated from the donor substrate, and thus the transfer layer is prevented from partially remaining on the donor substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display device, comprising:
a substrate;
a thin film transistor formed on the substrate;
a pixel electrode formed on the thin film transistor and electrically connected to the thin film transistor;
a pixel definition layer formed on the pixel electrode so as to define a pixel region;
an emission layer formed on the pixel electrode and contacting the pixel electrode in the pixel region; and
an interlayer formed on the pixel definition layer and contacting part of the emission layer;
wherein one side of the interlayer has an uneven shape so that a surface area of the interlayer increases; and
wherein an upper side of the interlayer has an uneven shape and a part of the upper side of the interlayer has protrusions and depressions.

2. The OLED display device of claim 1, wherein the uneven shape is irregular.

3. The OLED display device of claim 1, wherein the interlayer is formed along an edge of the emission layer.

4. The OLED display device of claim 3, wherein the interlayer is formed in a round shape so that the pixel electrode disposed in the pixel region is exposed.

5. An OLED display device, comprising:
a substrate;
a thin film transistor formed on the substrate;
a pixel electrode formed on the thin film transistor and electrically connected to the thin film transistor;
a pixel definition layer formed on the pixel electrode so as to define a pixel region; and
an emission layer formed on the pixel electrode and contacting the pixel electrode in the pixel region;
wherein one side of the pixel definition layer is hydrophilic, and wherein the emission layer covers the pixel electrode and the one side of the pixel definition layer; and
wherein an upper side of the pixel definition layer is hydrophilic.

6. The OLED display device of claim 5, wherein the one side of the pixel definition layer is treated with plasma using one of oxygen, nitrogen and argon.

7. The OLED display device of claim 5, further comprising an interlayer formed on the pixel definition layer and contacting part of the emission layer.

8. The OLED display device of claim 7, wherein one side of the interlayer has an uneven shape so that a surface area of the interlayer increases.

9. The OLED display device of claim 8, wherein the uneven shape is irregular.

10. The OLED display device of claim 8, wherein an upper side of the interlayer has an uneven shape.

11. The OLED display device of claim 10, wherein a part of the upper side of the interlayer has protrusions and depressions.

12. The OLED display device of claim 7, wherein the interlayer is formed along the edge of the emission layer.

13. The OLED display device of claim 7, wherein the interlayer is formed in a round shape so that the pixel electrode disposed in the pixel region is exposed.

14. An organic light emitting diode (OLED) display device, comprising:

a substrate;
a thin film transistor formed on the substrate;
a pixel electrode formed on the thin film transistor and electrically connected to the thin film transistor;
a pixel definition layer formed on the pixel electrode so as to define a pixel region;
an emission layer formed on the pixel electrode and contacting the pixel electrode in the pixel region; and
an interlayer formed on the pixel definition layer and contacting part of the emission layer;
wherein one side of the interlayer has an uneven shape so that a surface area of the interlayer increases; and
wherein one side of the pixel definition layer is hydrophilic, and the emission layer covers the pixel electrode and the one side of the pixel definition layer.

15. The OLED display device of claim 14, wherein an upper side of the pixel definition layer is hydrophilic.

16. The OLED display device of claim 14, wherein the one side of the pixel definition layer is treated with plasma using one of oxygen, nitrogen and argon.

* * * * *